(12) United States Patent
Kwok et al.

(10) Patent No.: US 8,949,698 B2
(45) Date of Patent: Feb. 3, 2015

(54) METHOD, APPARATUS AND SYSTEM FOR HANDLING DATA FAULTS

(71) Applicants: Zion S. Kwok, Vancouver (CA); Scott Nelson, Vancouver (CA)

(72) Inventors: Zion S. Kwok, Vancouver (CA); Scott Nelson, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 13/629,295

(22) Filed: Sep. 27, 2012

(65) Prior Publication Data

US 2014/0089758 A1  Mar. 27, 2014

(51) Int. Cl.
*H03M 13/00* (2006.01)
*G11C 29/00* (2006.01)

(52) U.S. Cl.
USPC .............................. 714/782; 714/767; 714/773

(58) Field of Classification Search
None
See application file for complete search history.

(56) References Cited

U.S. PATENT DOCUMENTS

| | | | |
|---|---|---|---|
| 4,764,927 A * | 8/1988 | Izumita et al. ................. 714/761 |
| 5,455,939 A * | 10/1995 | Rankin et al. .................. 714/6.2 |
| 5,754,753 A * | 5/1998 | Smelser ........................ 714/6.13 |
| 5,996,105 A * | 11/1999 | Zook .............................. 714/755 |
| 7,304,893 B1 * | 12/2007 | Hemink .................... 365/185.22 |
| 7,355,892 B2 * | 4/2008 | Hemink .................... 365/185.22 |
| 7,676,730 B2 * | 3/2010 | Haugan et al. ................. 714/769 |
| 8,281,217 B2 * | 10/2012 | Kim et al. ...................... 714/763 |
| 8,347,152 B2 * | 1/2013 | Zheng et al. ................... 714/704 |
| 2005/0149819 A1 * | 7/2005 | Hwang .......................... 714/758 |
| 2006/0256615 A1 * | 11/2006 | Larson ..................... 365/185.09 |
| 2012/0221920 A1 * | 8/2012 | Blaum et al. .................. 714/758 |
| 2012/0331367 A1 * | 12/2012 | Blaum et al. .................. 714/755 |

* cited by examiner

*Primary Examiner* — Daniel McMahon
(74) *Attorney, Agent, or Firm* — Blakely, Sokoloff, Taylor & Zafman LLP

(57) ABSTRACT

Techniques and mechanisms for handling data faults in a memory system which includes multiple integrated circuit (IC) dies, each die including a respective one of multiple memory arrays. In an embodiment, control logic monitors for a die failure of the multiple dies, and further monitors for a request to perform error correction for the multiple memory arrays. Each of the multiple memory arrays may store a respective vertical error correction code specific to data of that memory array. Another IC die may store a Bose, Ray-Chaudhuri, Hocquenghem (BCH) code of a horizontal codeword which spans the multiple memory arrays. In another embodiment, the BCH code is available to decode logic for data recovery operations in response to a die failure, where the BCH code is further available to the decode logic for error correction operations when all of the memory arrays are operative.

30 Claims, 8 Drawing Sheets

METHOD, APPARATUS AND SYSTEM FOR HANDLING DATA FAULTS

BACKGROUND

1. Technical Field

The present invention relates generally to computer memory systems, and more specifically to the handling of data faults.

2. Background Art

Conventional hard disk systems implement data recovery with parity protection across multiple disks, so that data will be protected even if one disk fails. RAID (Redundant Array of Independent Disks) architectures have been developed to allow recovery from such disk failures. In a typical hard disk system, an XOR (Exclusive-OR) parity of data from a number of disks is maintained on a redundant disk. In the event of a disk failure, the data on the failed disk is reconstructed by XORing the data on the surviving disks. The reconstructed data is written to a spare disk.

A solid state drive (SSD) faces an analogous problem if the SSD comprises multiple NAND memory (or other memory) dies that all store data. In such an SSD, there is a finite probability that one such memory die will fail. With the increase in use of SSDs in a wider range of applications, there is an increasing susceptibility of computer systems to such die failures. Moreover, the rapid growth of SSD storage capacity also increases the likelihood of such computer systems encountering prolonged data recovery time in the event of die failure. For at least these reasons, the performance of SSD memory systems are increasingly sensitive to incremental improvements in efficient utilization of resources to provide for data recovery.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide for efficient utilization of a Bose, Ray-Chaudhuri, Hocquenghem (BCH) code for a codeword which spans multiple memory arrays which, in turn, reside on different respective integrated circuit (IC) dies of a memory subsystem. In an embodiment, such a BCH code is made available for use in data recovery operations which take place, for example, in response to a failure of one of the IC dies. The BCH code may further be made available for use in error correction operations to correct soft errors in data which is accessible from the multiple memory arrays—e.g. where such error correction is performed while all of the dies are operative and accessible to BCH decode logic.

Figure 1:
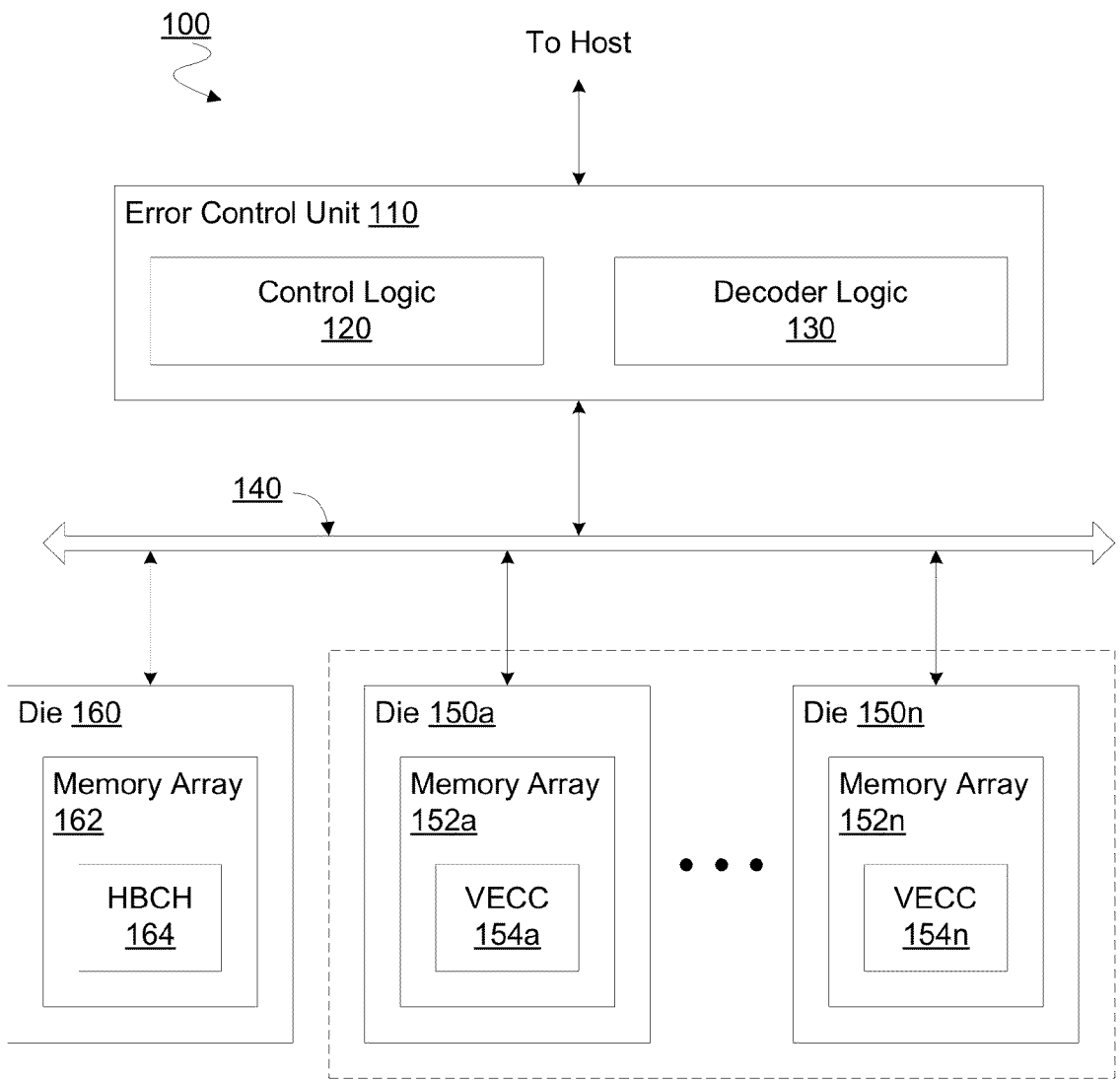
FIG. 1 is a block diagram illustrating elements of a computer system for handling a data fault according to an embodiment.

FIG. 1 shows elements of an illustrative computer system 100 for handling a data fault according to an embodiment. Computer system 100 may, for example, include a hardware platform of a personal computer such as a desktop computer, laptop computer, a handheld computer—e.g. a tablet, palmtop, cell phone, media player, and/or the like—and/or other such computer system. Alternatively or in addition, computer system 100 may provide for operation as a server, workstation, or other such computer system. In an embodiment, computer system 100 includes logic to make one or more BCH codes available for both error correction and data recovery, where such one or more BCH codes are for respective BCH codewords which variously span memory arrays of different IC dies.

Computer system 100 may include an error control unit 110 and a plurality of integrated circuit (IC) dies which each include a respective memory array to variously store data, error correction codes and/or other information—e.g. where error control unit 110 supports access to some or all such information by a host. By way of illustration and not limitation, computer system 100 may comprise multiple integrated circuit (IC) dies $150a, \ldots, 150n$ which include, respectively, memory arrays $154a, \ldots, 154n$. In an embodiment, computer system 100 further comprises a die 160 including memory array 162. Die 160 and multiple dies $150a, \ldots, 150n$ may be variously coupled directly or indirectly to each other and/or to error control unit 110 by any of a variety of one or more interconnects—e.g. including an illustrative memory bus 140. Some or all of memory arrays $152a, \ldots, 152n, 162$ may be of a solid-state technology (e.g., NAND, NOR, phase change, etc.) that is susceptible to data corruption. Memory arrays $152a, \ldots, 152n, 162$ may be of a single memory type, although certain embodiments are not limited in this regard.

In an embodiment, memory arrays $152a, \ldots, 152n, 162$ include one or more arrays variously comprised of vertically integrated memory cells. By way of illustration and not limitation, memory arrays $152a, \ldots, 152n, 162$ may include one or more phase change memory and switch (PCMS) arrays. Alternatively or in addition, memory arrays $152a, \ldots, 152n, 162$ may include one or more arrays which each comprise a ferroelectric material for implementing non-volatile storage. For example, memory arrays $152a, \ldots, 152n, 162$ may include one or more ferroelectric RAM (FeRAM) arrays and/or one or more ferroelectric transistor RAM (FeTRAM) arrays. Alternatively or in addition, memory arrays $152a, \ldots, 152n, 162$ may include one or more nanowire-based arrays to provide charge-trapping mechanisms for non-volatile data storage. System 100 may include any of a variety of additional or alternative types of memory arrays, according to different embodiments.

Error control unit 110 may be, or operate with, a memory controller of computer system 100 to communicate with the host—e.g. where the memory controller is for receiving and servicing memory access requests from the host, exchanging data with the host and/or controlling operation of one or more of dies $150a, \ldots, 150n, 160$. In an embodiment, error control unit 110 includes logic—e.g. including hardware, firmware and/or executing software—to handle one or more types of data faults associated with memory arrays $152a, \ldots, 152n, 162$. As used herein, "data fault" refers to an actual or expected failure of data to be available from a memory as it was previously stored in the memory. A data fault may include, or be due to, corruption of a bit or bits of data—e.g.

due to unpredictable and non-repeating errors in memory cells caused by random radiation events, known as soft errors. Soft errors, also referred to herein as random errors, may change data while it is stored in a memory location which remains accessible to error control unit 110. Handling of a soft error may include performing one or more error correction operations to change the corrupted bit (or bits) to a correct value.

Alternatively or in addition, a data fault may include, or be due to, an unavailability of an entire row, array or other block of memory. Such unavailability may, for example, be due to an actual or expected die failure or other hardware error which erases or otherwise renders inaccessible any version—e.g. whether a correct version or a version with one or more soft errors—of a block of previously stored data. Handling such unavailability may include performing one or more data recovery operations to derive (also referred to herein as "recover"), based on other available information, a version of data which has been rendered unavailable. Certain features of various embodiments are discussed in terms of unavailability of data due to erasure of a block of data. However, such discussion may be extended to additionally or alternatively apply to types of hardware errors—e.g. including die failures—which otherwise render blocks of data unavailable.

Error control unit 110 may include logic to perform error correction code (ECC) encoding or decoding—e.g. depending on a direction (e.g., read or write) in which data is being transferred. In some implementations, error control unit 110 may be implemented via dedicated, purpose-designed logic, but in some implementations, error control unit 110 may include one or more processor cores or other such programmable circuit logic for executing one or more encoding or decoding (herein, referred to more generally as "coding") processes for error correction. Error control unit 110 may perform any of a variety of ECC algorithms including, but not limited to, one or more types of BCH coding computations.

Error control unit 110 also may, for example, decode data using previously-generated error correction code information prior to sending such data to the host. In this manner, data may be checked, and one or more errors introduced during storage in memory arrays 152a, . . . , 152n, 162 may be corrected by error control unit 110 prior to providing the data to the host. For example, error correction unit 110 may include control logic 120—e.g. including hardware, firmware and/or executing software—to monitor for a request to perform error correction for data of one or more of memory arrays 152a, . . . , 152n. Such a request may include, for example, by an explicit request for error correction from the host or from other memory controller logic within, or coupled to, error control unit 110. By way of illustration and not limitation, other memory controller logic may send such an explicit request to control logic 120 in response to an expiration of a pre-determined period of time, where the request is to implement a scheduled error correction routine. Alternatively or in addition, such a request may be to implement error detection/correction for data in response to the memory controller logic receiving a request from the host to read such data from memory arrays 152a, . . . , 154n. Any of a variety of additional or alternative requests to perform error detection may be monitored by control logic 120, according to different embodiments.

Error control unit 110 may further include decoder logic 130—e.g. including hardware, firmware and/or executing software—to variously provide error correction decode functionality responsive to control logic 120. In an embodiment, if monitoring control logic 120 detects a request to perform error correction, decoder logic 130 may perform such error detection based on one or more error correction codes stored in memory arrays 152a, . . . , 152n, 162.

Control logic 120 may additionally or alternatively monitor for an indication of a failure of one of dies 150a, . . . , 150n—e.g. where the failure results in the memory array of the failed die having its data erased or otherwise rendered unavailable. A die failure may include, merely partial failure and/or temporary failure, for example. Detecting an indication of a die failure may include, for example, determining that a die has failed to provide any response to one or more control signals, has failed to assert a presence signal, has changed a level and/or type of power consumption, has failed to implement one or more data refresh operations and/or the like. Alternatively or in addition, detecting a die failure may include detecting a failure of soft error correction operations to successfully change data to its correct, earlier-in-time state. Any of a variety of additional or alternative indicia of die failure may be monitored by control logic 120, according to different embodiments. Decoder logic 130 may be further responsive to control logic 120 detecting an indication of such a die failure. For example, decoder logic 130 may perform data recovery in response to detection of die failure, the data recovery to recalculate the unavailable data previously stored in the memory array of the failed die. In an embodiment, a detected indication of die failure may result in data recovery operations being performed independent of any confirmation of actual die failure.

Certain embodiments variously provide for efficient use one or more BCH codes—and, in an embodiment, error correction encoding circuitry—for both error correction operations and data recovery operations. As used herein, error correction refers to changing one or more bits of accessible data which have been improperly corrupted since some earlier storing of that data. By contrast, data recovery, as used herein, refers to recalculating data—e.g. a block of data—which is simply no longer accessible. Certain embodiments variously perform error correction for data stored by memory arrays 152a, . . . , 152n while each of multiple dies 150a, . . . , 150n is operable, and respective data of each of memory arrays 152a, . . . , 152n may be accessed by error control unit 110. Such embodiments may additionally or alternatively perform data recovery when one of dies 150a, . . . , 150n has failed, and previously stored data of a failed dies' memory array is unavailable.

In an embodiment, each of the multiple memory arrays 152a, . . . , 152n stores at least one respective error correction code which is specific to data stored in that memory array. By way of illustration and not limitation, memory arrays 152a, . . . , 152n may store, respectively, vertical error correction (VEC) codes VECC 154a, . . . , 154n which are each specific to data of the respective one of memory arrays 152a, . . . , 152n. Additionally or alternatively, memory array 162 may store at least one BCH code which is for respective data of each of the multiple memory arrays 152a, . . . , 152n. By way of illustration and not limitation, memory array 162 may store horizontal BCH code HBCH 164 which is based on respective data of each of multiple memory arrays 152a, . . . , 152n. In an embodiment, HBCH 164 is of a Reed-Solomon (RS) code type.

As used herein with respect to handling data faults, "vertical" and "horizontal" are relative terms which distinguish between any two types of coding for a common set of data, where the two types of coding are orthogonal to one another. By way of illustration and not limitation, VEC codes 154a, . . . , 154n may be considered "column-wise" codes in the sense that each is based on data within only a respective one of memory arrays 150a, . . . , 150n. By contrast, HBCH 164 may be considered a "row-wise" code in the sense that it is based on different respective data within each of memory arrays 150a, . . . , 150n. It will be understood that such vertical and horizontal designations may be switched with one another and/or such column and row designations may be switched with one another. Various embodiments make a BCH-type—e.g. a Reed-Solomon—horizontal code available both for die recovery when one of the dies has failed and for correcting random errors when none of the dies have failed.

Figure 2A:
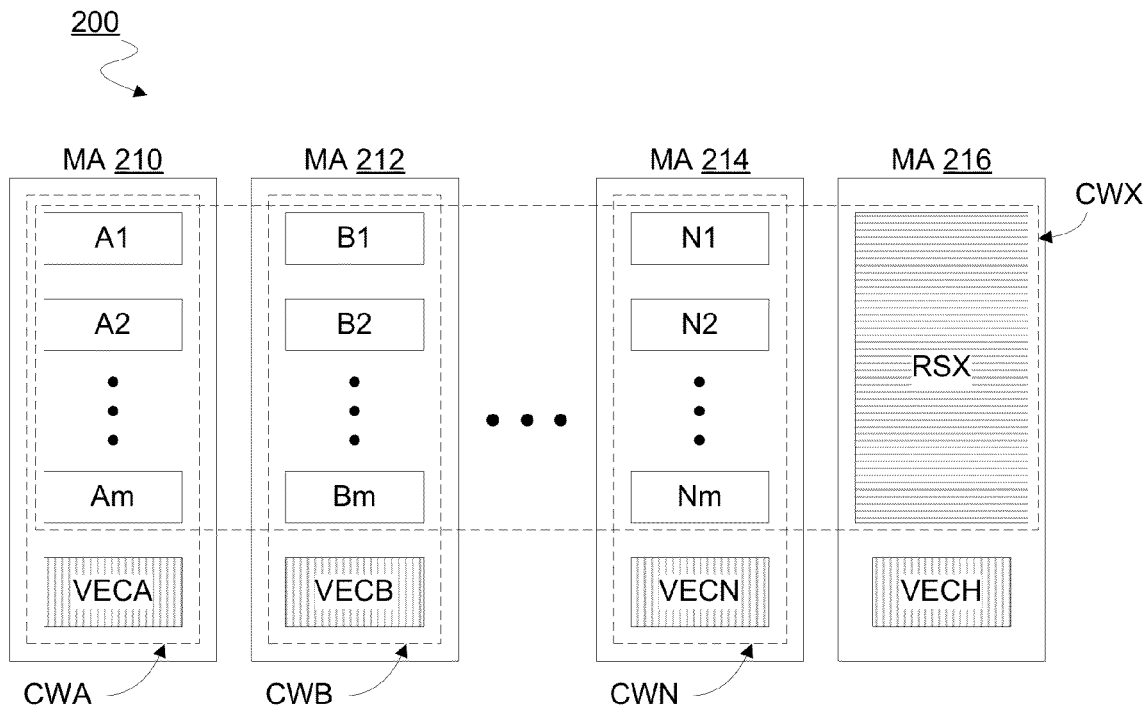
FIGS. 2A-2C are block diagrams which each illustrate elements of a respective memory system for which data fault handling is provided according to an embodiment.

FIG. 2A illustrates elements of a memory system 200 for which data fault handling is provided according to an embodiment. Memory system 200 may include some or all of the features of computer system 100, for example. In an embodiment, data fault handling for memory system 200 is provided by logic which provides some or all functionality of error correction unit 110.

Memory system 200 may include multiple memory arrays—e.g. including the illustrative memory arrays 210, 212, . . . , 214—where each memory array (MA) is of a different respective IC die of multiple dies. At some point in time during operation of memory system 200, MA 210 may, for example, store a vertical codeword CWA comprising data A1, A2, . . . , Am and a VEC code VECA which is specific to A1, A2, . . . , Am. For example, VECA may have been calculated based on an earlier-in-time version of A1, A2, . . . , Am. VECA may be used—e.g. by error control unit 110 or functionally equivalent logic—to perform error detection and/or correction for a comparatively later-in-time version of A1, A2, . . . , Am—e.g. where such a later-in-time version may have one or more soft errors. Similarly, MA 212 may store a vertical codeword CWB comprising data B1, B2, . . . , Bm and a VEC code VECB which is specific to B1, B2, . . . , Bm. Alternatively or in addition, MA 214 may store a vertical codeword CWN comprising data N1, N2, . . . , Nm and a VEC code VECN which is specific to N1, N2, . . . , Nm, and/or the like. Memory arrays 210, 212, . . . , 214 may each include any of a variety of additional or alternative vertical codewords, according to different embodiments.

Memory system 200 may further include at least one horizontal BCH codeword spanning both each of the multiple arrays 210, 212, . . . , 214 and a first memory array 216 of a die coupled to the multiple dies. Certain features of various embodiments are discussed herein in terms of a horizontal BCH codeword CWX which is a Reed-Solomon codeword. However, such discussion may be extended to apply to various other types of horizontal BCH codewords. By way of illustration and not limitation, at some point in time during operation of memory system 200, MA 216 may store a RS code RSX of horizontal codeword CWX. Respective data in each of memory arrays 210, 212, . . . , 214 (e.g. including values from each of data A1, A2, . . . , Am, data B1, B2, . . . , Bm, etc. and data N1, N2, . . . , Nm,) may be included in horizontal codeword CWX, where RSX is calculated based on an earlier-in-time version of such respective data. In some embodiments, a horizontal BCH codeword further spans two or more memory arrays (not shown)—e.g. each of a different respective die—which, with respect to vertical error correction coding, operate logically as a single memory array.

RS-type horizontal decoding may be performed, in an embodiment, to implement data recovery for a failed die. Such horizontal decoding may be based on information which identifies data of a codeword as being unavailable. For example, RS decode logic (or other logic for performing horizontal BCH decode operations for data recovery) may receive information identifying the location of data bits—e.g. the location of a data symbol or data symbols—in a codeword which are to be recovered. Such information may, for example, be provided by control logic which indicates the location of such bits in response to identifying the failed die. Information identifying the location of data which to be recovered may provide for efficiency in horizontal BCH decode operations. For example, such information may allow for BCH decoding of a horizontal codeword based on relatively fewer bits of BCH code information.

In an embodiment, RS-type horizontal decoding may further be useful for correcting random errors in a situation where no dies have failed. For example, each of vertical error correction codes VECA, VECB, . . . , VECN and RSX may be used, together with RSX—e.g. by turbo product decode logic—to provide improved error correction strength. In an embodiment, MA 216 includes a vertical codeword comprising RSX and a VEC code VECH which is based on an earlier-in-time version of RSX. VECH may, for example, provide additional protection by supporting error correction for RSX prior to use of RSX in random error correction and/or data recovery.

Figure 2B:
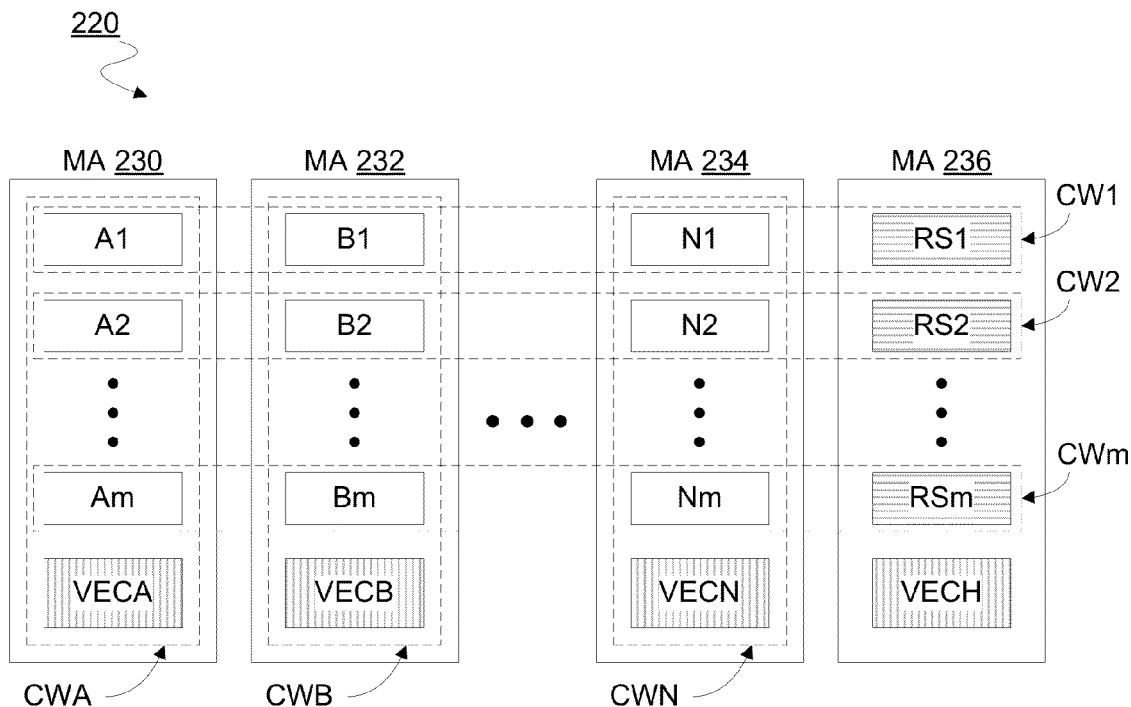

In the illustrative embodiment of memory system 200, RSX is for all data (i.e. other than VEC codes) of memory arrays 210, 212, . . . , 214 for which data fault handling is variously supported by VECA, VECB, . . . , VECN. In another embodiment, an array such as MA 216 may store multiple RS symbols which are each for a respective subset of such data. For example, FIG. 2B illustrates elements of a memory system 220 for which data fault handling is provided according to an embodiment. Data fault handling for memory system 220 may be provided by logic which provides some or all of the functionality of error correction unit 110. To aid in demonstrating certain features of various embodiments, memory system 220 is shown storing data similar to that stored in memory system 200. For example, memory system 220 may include memory arrays 230, 232, . . . , 234 which, at a point in time, store the corresponding data stored in memory arrays 210, 212, . . . , 214, respectively. However, any of a variety of additional or alternative data may be variously stored by memory arrays 230, 232, . . . , 234.

MA 230 may include a vertical codeword CWA comprising data A1, A2, . . . , Am and VEC code VECA for A1, A2, . . . , Am. Similarly, MA 232 may include a vertical codeword CWB comprising data B1, B2, . . . , Bm and VEC code VECB for B1, B2, . . . , Bm. Alternatively or in addition, MA 234 may include a vertical codeword CWN comprising data N1, N2, . . . , Nm and VEC code VECN for N1, N2, . . . , Nm.

Figure 2C:
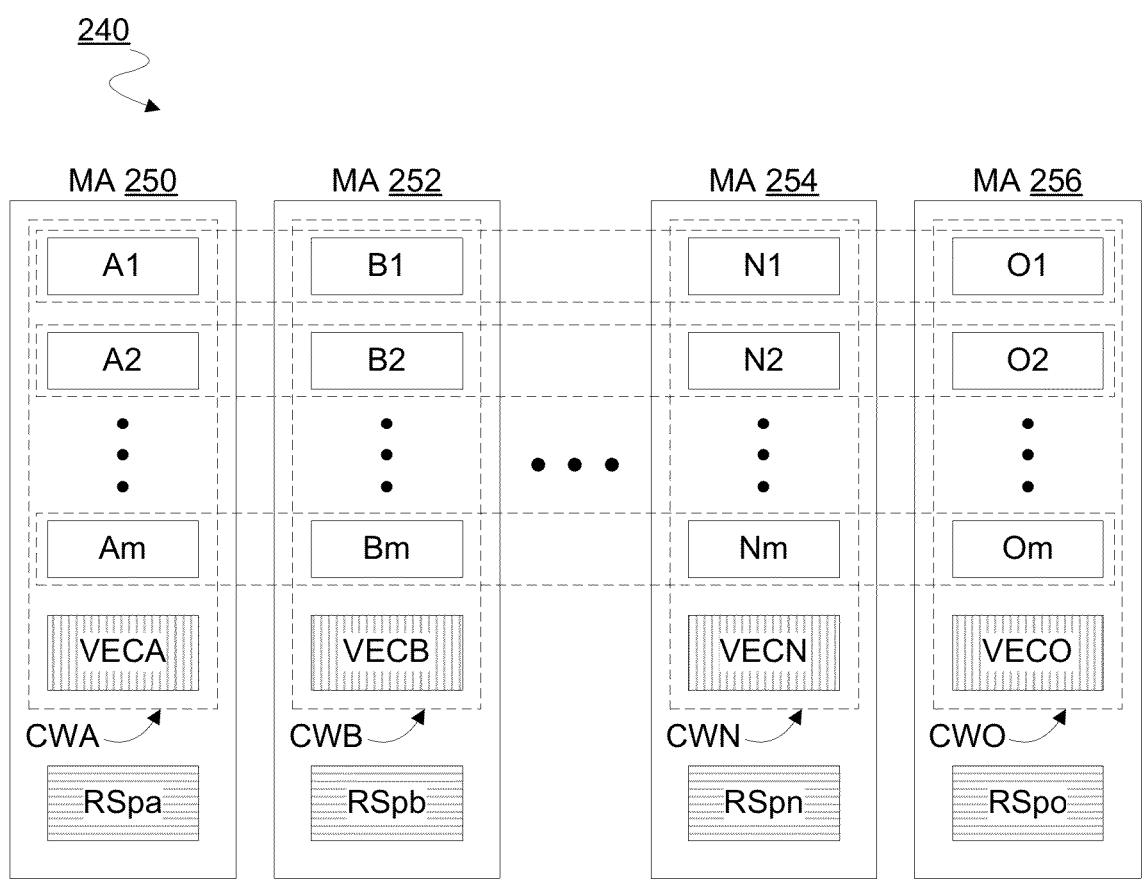

Memory system 220 may further include MA 236—e.g. corresponding functionally to MA 216—which stores multiple BCH codes RS1, RS2, . . . , RSm for horizontal codewords CW1, CW2, . . . , CWm, respectively. In an embodiment, RS1, RS2, . . . , RSm are Reed-Solomon codes. Horizontal codeword CW1 may comprise A1, B1, . . . , N1 and RS1, which are based on an earlier-in-time version of A1, B1, . . . , N1. Similarly, horizontal codeword CW2 may comprise A2, B2, . . . , N2 and RS2, which are based on an earlier-in-time version of A2, B2, . . . , N2, and horizontal codeword CWm may comprise Am, Bm, . . . , Nm and RSm, which based on an earlier-in-time version of Am, Bm, . . . , Nm In still another embodiment, horizontal RS code information may be distributed across the multiple memory arrays. For example, FIG. 2C illustrates elements of a memory system 240 for which data fault handling is provided according to an embodiment. Data fault handling for memory system 240 may be provided by logic which provides some or all of the functionality of error correction unit 110. To aid in demonstrating certain features of various embodiments, memory system 240 is shown storing data similar to that stored in memory system 220 (and in memory system 200). For example, memory system 240 may include memory arrays 250, 252, . . . , 254 which, at a point in time, store the corresponding data stored in memory arrays 210, 212, . . . , 214, respectively. However, any of a variety of additional or alternative data may be variously stored by memory arrays 250, 252, . . . , 254.

MA 250 may include a vertical codeword CWA comprising data A1, A2, . . . , Am and VEC code VECA for A1, A2, . . . , Am. Similarly, MA 252 may include a vertical codeword CWB comprising data B1, B2, . . . , Bm and VEC code VECB for B1, B2, . . . , Bm. Alternatively or in addition, MA 254 may include a vertical codeword CWN comprising data N1, N2, . . . , Nm and VEC code VECN for N1, N2, . . . , Nm. Memory system 240 may further include MA 256—e.g. corresponding functionally to MA 216—which stores vertical codeword CWO comprising data O1, O2, . . . , Om and VEC code VECO for O1, O2, . . . , Om.

In an embodiment, memory arrays 250, 252, . . . , 254, 256 further store different portions RSpa, RSpb, . . . , RSpn, RSpo of one or more horizontal RS codes each for a respective horizontal codeword spanning memory arrays 250, 252, . . . , 254, 256. By way of illustration and not limitation, portions RSpa, RSpb, . . . , RSpn, RSpo may each include different RS symbols (or portions thereof) of RS1, RS2, . . . , RSm. One or more of memory arrays 250, 252, . . . , 254, 256 may further store another VEC code (not shown) to provide for soft error correction for some or all of RSpa, RSpb, . . . , RSpn, RSpo—e.g. where memory arrays 250, 252, . . . , 254, 256 further store VECH of MA 236.

Figure 3:
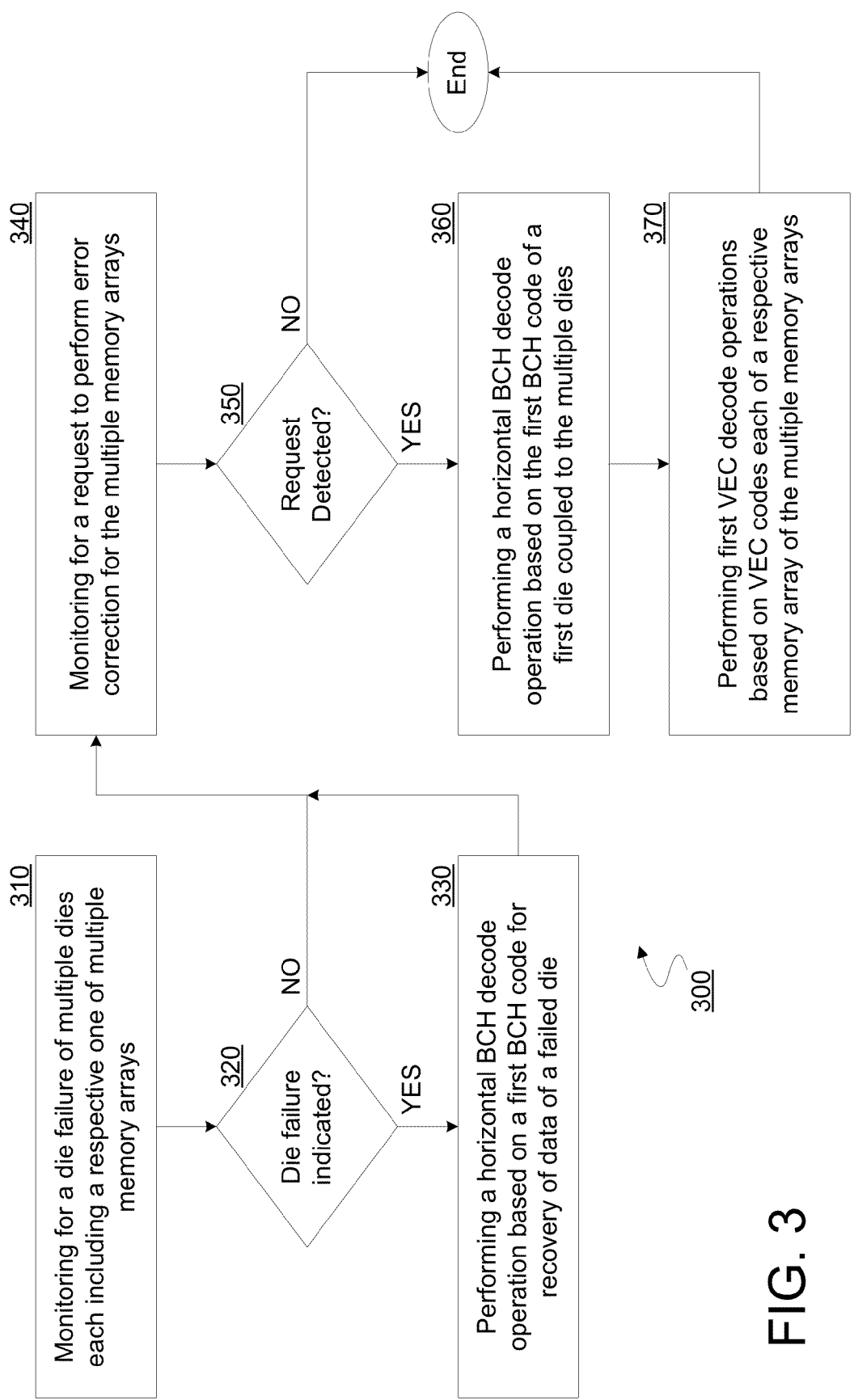
FIG. 3 is a flow diagram illustrating elements of a method for handling a data fault according to an embodiment.

FIG. 3 illustrates elements of a method 300 for handling a data fault according to an embodiment. Method 300 may be performed to protect an access of data in a system having some or all of the features of computer system 100, for example. In an embodiment, method 300 is performed by logic which provides some or all of the functionality of error control unit 110.

Method 300 may include, at 310, monitoring for a die failure of multiple dies which each include a respective one of multiple memory arrays. The monitoring at 310 may be performed by control logic 120, for example. In an embodiment, method 300 further comprises determining, at 320, whether the die failure is indicated by the monitoring at 310.

If the die failure is indicated at 320, then method 300 may, at 330, perform a horizontal BCH decode operation based on a first BCH code of a first die, the horizontal BCH decode operation for recovery of data of a failed die. The horizontal BCH decode operation performed at 330 includes Reed-Solomon decoding—e.g. where the first BCH code is a RS code. In an embodiment, the first die may be coupled to the multiple dies. The first BCH code may be for respective data of each of the multiple memory arrays. By way of illustration and not limitation, decoder logic 130 may decode a codeword comprising HBCH 164 and respective data stored in each of the memory arrays 154a, . . . , 154n other than the memory array of the failed die of dies 150a, . . . , 150n. The horizontal BCH decode operation performed at 330 may derive the erased or otherwise unavailable data of the failed die, and provide the derived data to a host and/or store the derived data in another memory array or, in an embodiment, back to the failed die if or when it is again operable.

In an embodiment, method 300 further performs VEC processing (not shown) in response to the detecting at 320—where the horizontal BCH decode operation performed at 330 is based on a result of such VEC processing. By way of illustration and not limitation, method 300 may such perform VEC decode operations based on VEC codes which are each of a respective memory array of the multiple memory arrays and specific to data of the respective memory array. Available data of a horizontal codeword may be at least partially error-corrected by such VEC decode operations, where the at least partially error-corrected result of the such VEC decode operations are provided as input for the horizontal BCH decode operation at 330 to recover unavailable data of that horizontal codeword. In an embodiment, the horizontal BCH decode operation performed at 330 are performed based on information which identifies (as such) the location(s) of codeword data which is to be recovered. Such information may allow for an economy of size of the first BCH code—e.g. where the first BCH code facilitates stronger data recovery with a relatively few total number of bits.

If the die failure is not indicated at 320, or after the horizontal BCH decode operation performed at 330, then method 300 may, at 340, monitor for a request to perform error correction for the multiple memory arrays. In an embodiment, method 300 further comprises determining, at 350, whether the request to perform error correction is detected by the monitoring at 340. The monitoring at 340 may be performed by control logic 120, for example. If the request to perform error correction is not detected at 350, then method 300 may end (or repeat, in another embodiment). If the request to perform error correction is detected at 350, then method 300 may perform the error correction.

In an embodiment, performing the error correction includes, at 360, performing a horizontal BCH decode operation based on the first BCH code. Performing the error correction may further include, at 370, performing first VEC decode operations based on VEC codes which are each of a respective memory array of the multiple memory arrays and specific to data of the respective memory array. By way of illustration and not limitation, the horizontal BCH decode operation performed at 360 may generate at least partially error-corrected data which is provided as input for additional error correction by the first VEC decode operations performed at 370. In an alternate embodiment, the first VEC decode operations performed at 370 may be performed first to generate at least partially error-corrected data which is provided as input for additional error correction by the horizontal BCH decode operation performed at 360. After the operations performed at 360, 370, method 300 may end (or repeat, in another embodiment).

The horizontal BCH decode operation performed at 360 may include Reed-Solomon decoding—e.g. where the first BCH code is a RS code. The horizontal BCH decode operation performed at 360 may include decoding a codeword which includes the first BCH code and corresponding data of each of the multiple memory arrays. By way of illustration and not limitation, decoder logic 130 may decode a codeword comprising HBCH 164 and respective data stored in each of the memory arrays 154a, . . . , 154n. The horizontal BCH decode operation performed at 360 may correct one or more errors—e.g. where error corrected data is written back to one of the multiple memory arrays, provided to vertical decode logic for further processing and/or the like. In an embodiment, the multiple memory arrays include one or more BCH codes (such as RSpa, RSpb, . . . , RSpn) which are each for respective data of each of the multiple memory arrays, wherein BCH decoding performed at 340 and/or 360 is further based on the one or more BCH codes.

The first VEC decode operations performed at 370 may include decoding multiple vertical codewords which are each stored in a respective memory array and specific to data of that respective memory array. By way of illustration and not limitation, decoder logic 130 may decode a vertical codeword each in a respective one of memory arrays 154a, . . . , 154n. The first VEC decode operations performed at 370 may correct one or more errors—e.g. where error corrected data is written back to one of the multiple memory arrays, provided to horizontal decode logic for further processing and/or the like.

Certain embodiments are not limited with respect to a particular sequence and/or concurrency of operations to variously monitor for a die failure, recover data from any such die failure, monitor for a request to perform error correction and perform any such error correction which may be requested. By way of illustration and not limitation, method 300 may alternatively perform the respective monitoring at 310 and 340 in reverse order or concurrently, according to different embodiments.

In an embodiment, the error correction performed in response to the detecting at 350 may include performing one or more additional operations (not shown) after the operations at 360, 370. By way of illustration and not limitation, the operations at 360, 370 may generate a first set of vertical codewords which, for example, are an at least partially error-corrected version of vertical codewords of the multiple memory arrays. In an embodiment, method 300 may further perform another horizontal BCH decode operation in response to an indication of one or more remaining data errors of the first set of vertical codewords. For example, a second horizontal BCH decode operation—similar to that at 330—may be performed to recover only one of the first set of vertical codewords, if no other of the first set of vertical codewords has a remaining data error. Alternatively, method 300 may, in response to detecting that there are remaining data errors in a plurality of the first set of vertical codewords, perform a second horizontal BCH decode operation—similar to that at 360—based on data of the first set of vertical codewords. Based on a result of the second horizontal BCH decode operation and the VEC codes, method 300 may further perform second VEC decode operations—e.g. similar to that at 370.

Figure 4:
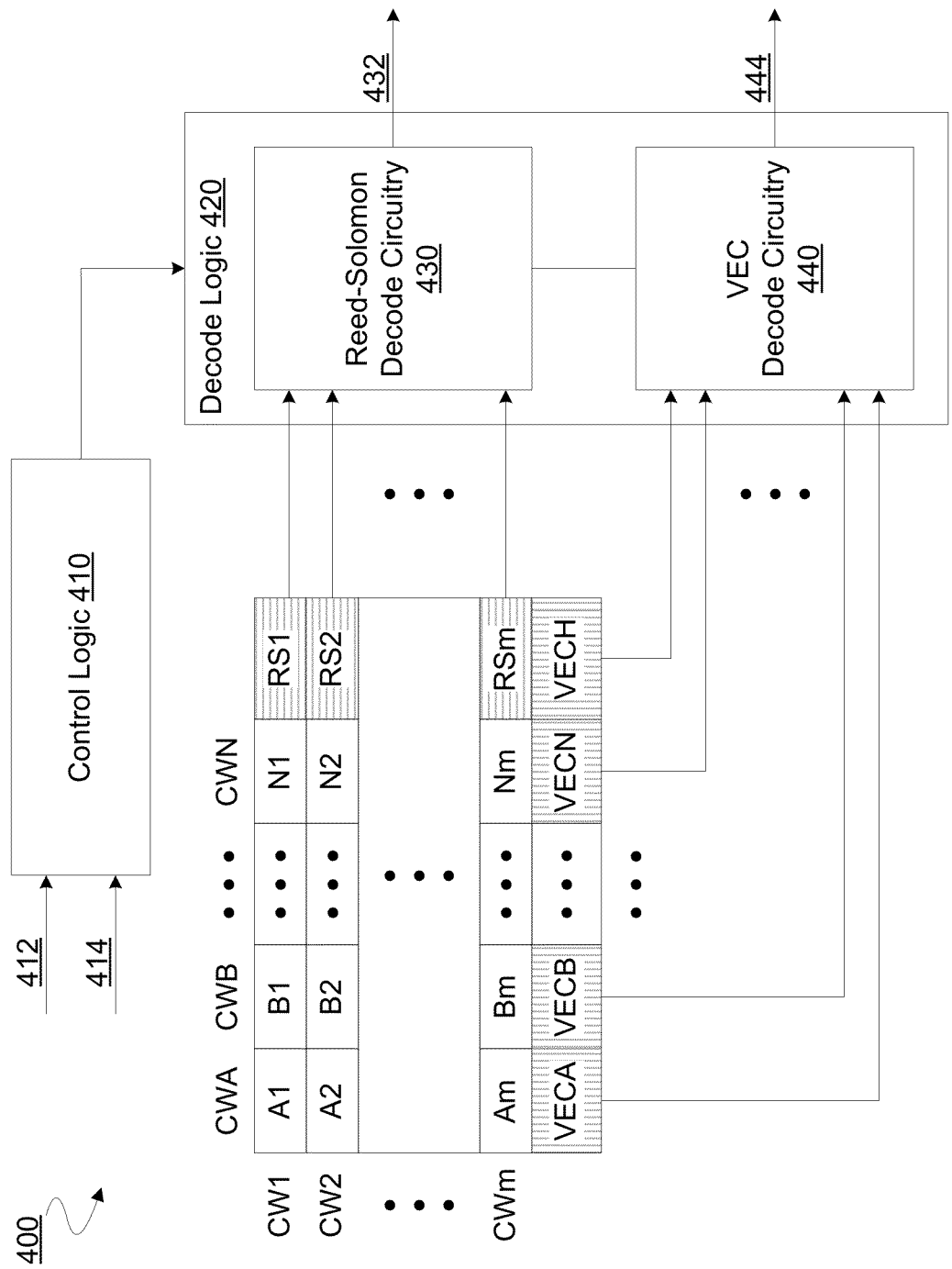
FIG. 4 is a block diagram illustrating elements of a memory system for handling a data fault according to an embodiment.

FIG. 4 illustrates elements of an error control system 400 for handling a data fault according to an embodiment. Error control system 400 may include some or all of the features of error control unit 100, for example. For example, error control system 400 may include control logic 410 and decode logic 420 each to provide some or all of the respective functionality of control logic 120 and decode logic 130. In an embodiment, control logic 410 and decode logic 420 perform method 300.

Error control system 400 may support both data recovery and error correction for multiple IC dies which each include a respective memory of multiple memory arrays. Each of the memory arrays may store a respective vertical codeword which is specific to data of that memory array, where a memory array of another IC die, coupled to the multiple dies, stores a BCH code of a horizontal BCH codeword which spans the multiple memory arrays. To illustrate certain features of various embodiments, error control system 400 is described with respect to supporting both data recovery and error correction for memory system 220. However, such discussion may be extended to apply to data recovery and/or error correction for any of a variety of additional or alternative multi-die memory systems.

In an embodiment, VEC codes VECA, VECB, . . . , VECN, one or more horizontal RS codes (represented by RS1, RS2, . . . , RSm), and associated data may be read directly from their respective memory arrays or, alternatively, written to temporary storage—e.g. where memory arrays 230, 232, . . . , 234, 236 are written in parallel into a static RAM (SRAM). In an illustrative scenario according to one embodiment, each of horizontal codewords CW1, CW2, . . . , CWm, includes 7-bit symbols, where RS1, RS2, . . . , RSm are each a horizontal code for respective memory arrays of eighteen (18) dies, where each horizontal codeword includes 72 symbols for data and 4 symbols for parity. In such an embodiment, decode logic 420 may, for a given horizontal codeword, be able to correct two (2) symbol errors and/or recover four (4) erased symbols.

In an embodiment, decode logic 420 accesses one or more horizontal BCH-type codewords—e.g. Reed-Solomon type codewords—striped across N dies. Such accessing may, for example, be in response to control logic 410 detecting an indication 412 of a failure of one of the multiple dies for memory arrays 230, 232, . . . , 234. Alternatively, such accessing may be in response to control logic 410 detecting an indication 414 of a request to perform error correction—e.g. the detecting of indication 414 while all of memory arrays 230, 232, . . . , 234 are operative and accessible.

By way of illustration and not limitation, one or more of horizontal codewords CW1, CW2, . . . , CWm may each be decoded by RS decode circuitry 430 of decode logic 420. For example, respective bits of A1, . . . , N1 and RS1 may be concatenated or otherwise combined with one another to form one or more data structures which are provided as an operand or operands for calculations to implement, at least in part, a horizontal RS decode for CW1. Any of a variety of conventional RS (or other BCH) decode techniques may be adapted to perform such calculations. Such conventional decode techniques are outside the scope of this disclosure, and are not limiting on certain embodiments.

In an embodiment, RS decode circuitry 430 may perform horizontal RS decode calculations to recover data of a failed die—e.g. in response to detection of indication 412 by control logic 410. In an embodiment, such horizontal RS decode calculations are further based on information—e.g. received from control logic 410—which identifies one or more locations in CW1 (or other horizontal codeword) for which data needs to be recovered. Decode operations of RS decode circuitry 430 may generate recovered data which is provided as part of output 432—e.g. for sending to a host process and/or for storage to the temporary storage to another die (e.g. other than the failed die) and/or to another repository.

Alternatively or in addition, RS decode circuitry 430 may perform other horizontal RS decode calculations for at least partial error correction of some or all of CW1, CW2, . . . , CWm—e.g. in response to detection of indication 414 by control logic 410. Such horizontal RS decode operations may generate at least partially error corrected data which, for example, is provided as part of output 432.

Alternatively or in addition, RS decode circuitry 430 may perform RS decode calculations to operate on data which is provided by VEC decode circuitry 440 of decode logic 420. VEC decode circuitry 440 may perform VEC decoding operations which are each based on a different respective one of VEC codes VECA, VECB, . . . , VECN—e.g. where such operations are each based on a different respective one of vertical codewords CWA, CWB, . . . , CWN. VEC codes VECA, VECB, . . . , VECN may be of any of a variety of code types including, but not limited to a BCH (such as a Reed-Solomon) code type, a Hamming code type, a convolutional code type, a low-density-parity-check code type and/or the like.

By way of illustration and not limitation, VEC decode circuitry 440 may receive respective bits of A1, A2, . . . , Am and VECA to be concatenated or otherwise combined with one another to form one or more data structures. VEC decode circuitry 440 may variously use such one or more data structures as an operand or operands for VEC decoding of CWA. Additionally or alternatively, VEC decode circuitry 440 may concatenate or otherwise combine respective bits of B1, B2, ..., Bm and VECB to form an operand or operands for VEC decoding of CWB. Similarly, VEC decode circuitry 440 may concatenate or otherwise combine respective bits of the received version of N1, N2, ..., Nm and VECN to form an operand or operands for VEC decoding of CWN. Any of a variety of conventional error correction calculation techniques may be adapted to perform such VEC decoding. Such conventional error correction calculation techniques are outside the scope of this disclosure, and are not limiting on certain embodiments. In an embodiment where VEC codes are BCH codes, VEC decoding may be implemented at least in part with a BCH encoder and/or a BCH syndrome calculator—e.g. to detect for zero-error codewords. Operations of VEC decode circuitry 440 may generate at least partially error-corrected data which is provided as part of output 444— e.g. for sending to a host process and/or for storage to the multiple memory arrays, temporary storage or other repository.

In an embodiment, VEC decode circuitry 440 provides such at least partially error-corrected data to horizontal BCH decode circuitry—e.g. to RS decode circuitry 430. Based on at least partially error-corrected data from VEC decode circuitry 440 and one or more horizontal BCH codes (e.g. some or all of RS1, RS2, ..., RSm) RS decode circuitry 430 may perform horizontal decode calculations to recover data of a failed die. Alternatively, RS decode circuitry 430 may perform other horizontal decode calculations when all dies are functional and when no data of the multiple memory arrays is inaccessible. Such other horizontal decode calculations—e.g. based on at least partially error-corrected data from VEC decode circuitry 440 and one or more horizontal BCH codes—may provide for further error correction of the at least partially error-corrected data.

In an embodiment, data recovery and/or error correction by decode logic 420 may be based on error correction for one or more horizontal BCH codes. By way of illustration and not limitation, VEC decode circuitry 440 may receive respective bits of RS1, RS2, ..., RSm and VEC code VECH for RS1, RS2, ..., RSm. Such bits may be combined with one another to form one or more operands for VEC decoding of a codeword which includes RS1, RS2, ..., RSm and VECH. Such VEC decoding may provide error correction for one or more of codes RS1, RS2, ..., RSm prior to use of such one or more codes in data recovery and/or error correction by decode logic 420.

In an embodiment, the SRAM (or other temporary storage) may be updated for VEC codewords resulting from processing. Additionally or alternatively, the one or more iterative decode operations may be implemented—e.g. based on a result of a first (or other) iteration of one or more error detection/correction operations. By way of illustration and not limitation, control logic 410 may evaluate a result of a round of decoding—e.g. the round including a horizontal decode operation by RS decode circuitry 430 and VEC operations by VEC decode circuitry 440—to determine a total number of resulting codewords which include at least one remaining data error. For brevity, a codeword which includes a data error is referred to as a failed codeword, and a codeword which includes no data errors is referred to as a codeword which passes.

If every codeword resulting from a round of decoding passes, then error correction may finish successfully. Additionally or alternatively, if one of the resulting codewords fails, control logic 410 may control further operation of RS decode circuitry 430 to recover the contents of the failed codeword—e.g. after which error correction may finish successfully. Additionally or alternatively, if two or more of the resulting codewords fail, another round of error correction processing by RS decode circuitry 430 and VEC decode circuitry 440 may be performed. In such an additional round, decoding by VEC decode circuitry 440 may be skipped for any vertical codewords which pass such additional processing by RS decode circuitry 430.

Figure 5A:
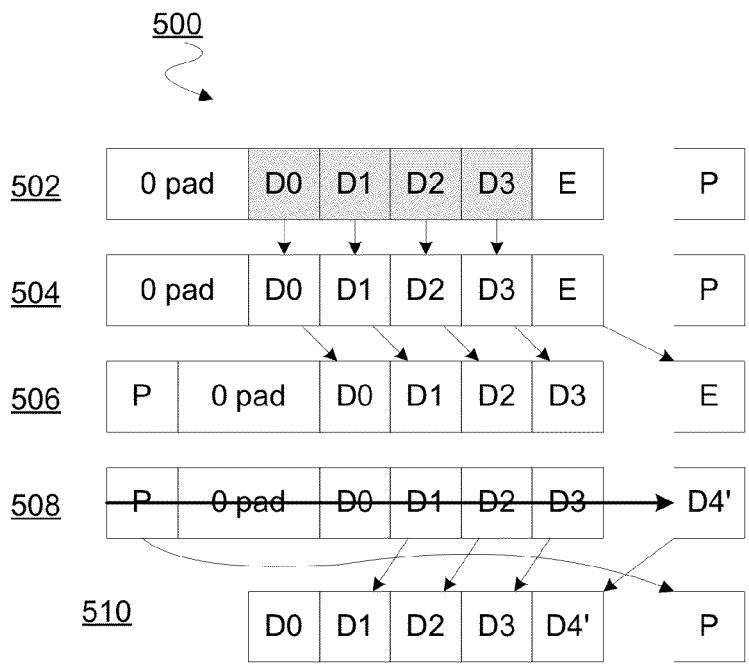
FIGS. 5A-5D are block diagrams which each illustrate elements of a respective data error correction calculation according to an embodiment.

In one embodiment, a test condition may be used to determine whether a horizontal RS decoding miscorrection is indicated. By way of illustration and not limitation, control logic 410 may evaluate whether, after some minimum number of decoding iterations, there remain two of more VEC codewords which have not passed a decode round. If such two or more VEC codewords are detected, then decode logic 420 may decode the current contents of the SRAM using only VEC decoding—i.e. and not also with processing by RS decode circuitry 430. Alternatively or in addition, decode logic 420 may quit after some threshold minimum number of decode iterations for which two or more resulting vertical codewords fail. FIG. 5A illustrates operations 500 to handle a data fault according to an embodiment. In an illustrative scenario according to one embodiment, operations 500 process a codeword 502 which includes a BCH parity value P and a string of data symbols having at least one erased symbol— e.g. an erased data symbol E which is preceded by illustrative data symbols D0, D1, D2, D3. Some or all of symbols D0, D1, D2, D3 may be potential victims of soft error corruption. In an embodiment, vertical BCH decoding for error correction may be applied to codeword 502 to generate a resulting codeword 504. In an embodiment, codeword 504 includes at least partially error corrected versions of symbols D0, D1, D2, D3. Such BCH error correction may, for example, be performed by decoder logic 130. In binary BCH decoding, for example, codeword symbols such as D0, D1, D2, D3, D4 each consist of a respective individual bit.

Additional error correction decoding based on codeword 504 may include zero (0) padding the symbols up to a nearest $(2^X-1)$ total number of bits, for some integer X. The zero-padded codeword may be cycle shifted to move an erased symbol E into the original position of the parity value P—e.g. resulting in an equivalent codeword 506. The cycle shifted codeword 506 may then be encoded according to the code type of the codeword, where such encoding generates codeword 508 including—e.g. in the position of the parity value P—a parity value D4' which is a recovered value for the erased symbol E. The codeword 508 may then be cycle shifted to move the generated value D4' into the original position of the erased symbol E, forming codeword 510.

Figure 5B:
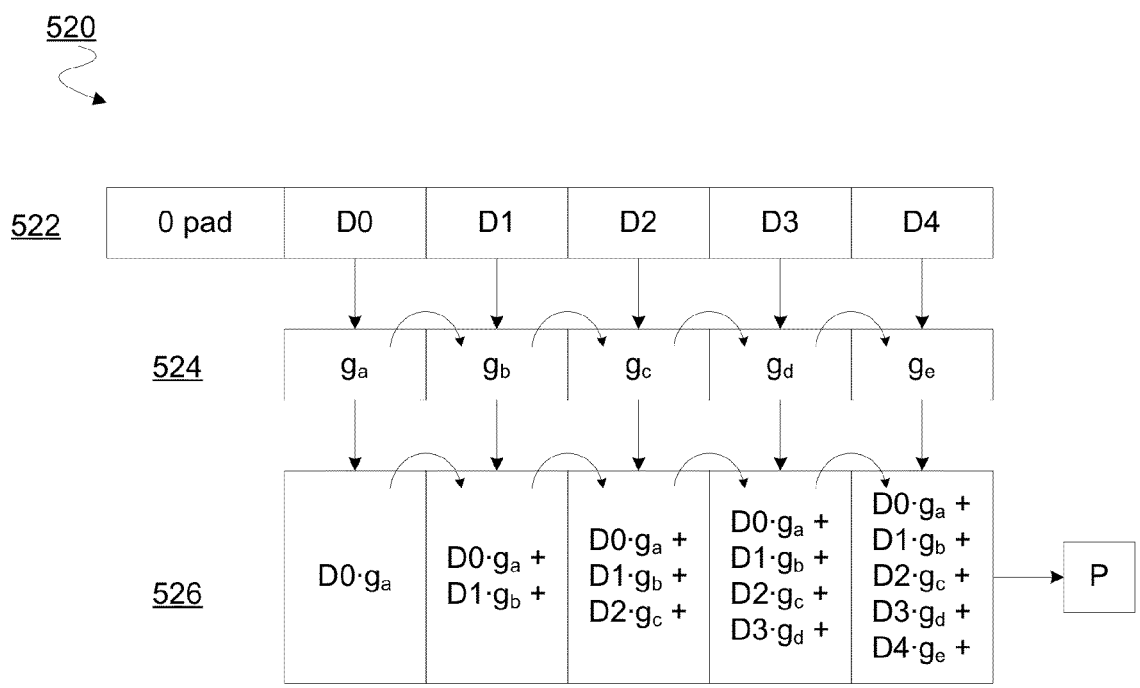

FIG. 5B illustrates operations 520 of BCH encoder logic to generate a BCH the parity value P which is subsequently used in operations 500. Such BCH encoder logic may operate serially—e.g. encoding a few bits at a time as it traverses a codeword 522. In an embodiment, the BCH encoder logic initializes g-register 524 at the start of encoding to store a vector $g_a$ of generator matrix G. After initialization, the vector in the g-register 524 may be updated recursively with successive vectors of generator matrix G—e.g. where determining a vector $g_{n+1}$ of the generator matrix G is a result of a linear feedback shift register LFSR shift of the preceding vector $g_n$. Generating a vector $g_{n+1}$ of the generator matrix G based on a preceding vector $g_n$ of the generator matrix G may be according to conventional techniques which are beyond the scope of this disclosure, and are not limiting on certain embodiments.

Such shifting may allow for only one vector being stored in g-register 524 at a time. In an embodiment, operations 520 may calculate for each of data D0, D1, D2, D3, D4 of codeword 522 a product of that data and a respective vector of g-register 524. Such products may be successively added into a summation 526 which results in calculation of BCH code P. In an embodiment, Galois field multiplication may calculate respective components of summation 526, and Galois field addition may sum such multiple components.

Figure 5C:
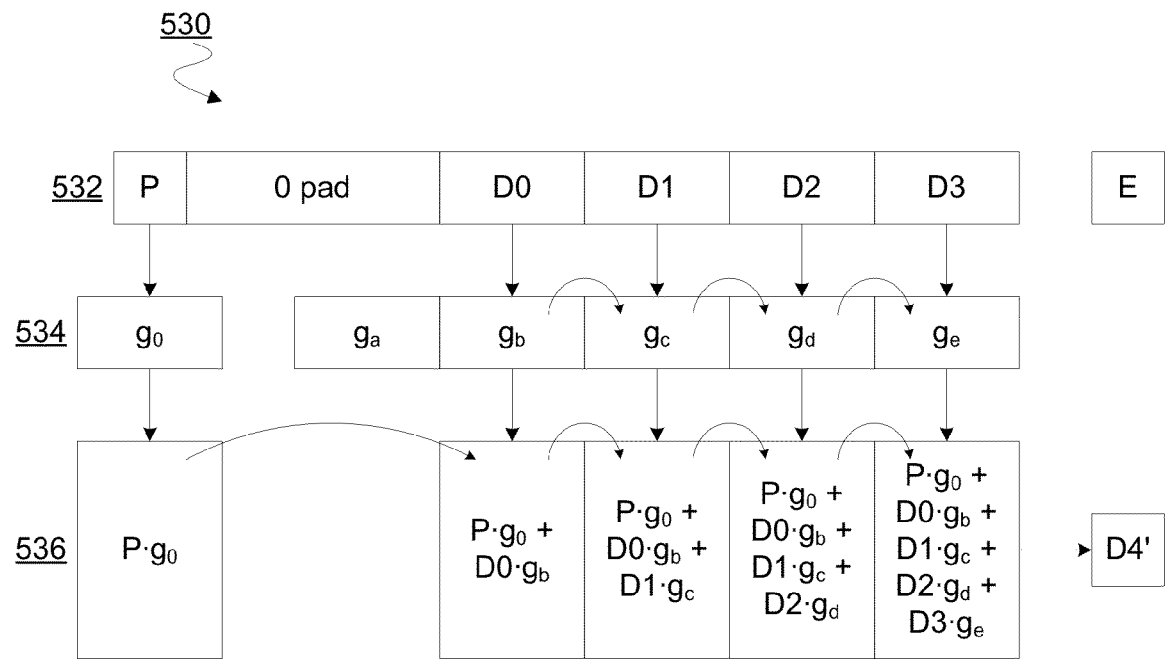

FIG. 5C illustrates operations 530 of BCH encoder logic to recover a data value D4' such as that generated according to different techniques of operations 500. Such BCH encoder logic may be that which performed operations 520 to generate BCH parity value P. The BCH encoder logic may operate serially—e.g. encoding a few bits at a time as it traverses a codeword 532. Similar to codeword 506, for example, codeword 532 may be zero (0) padded and cycle shifted to move an erased symbol E into the position of the parity value P. In an embodiment, the BCH encoder logic initializes g-register 534 at the start of encoding to store a vector $g_0$ of generator matrix G. Operations may calculate a product of P and $g_0$ for storage as an intermediate value of a summation 536. Subsequently, g-register 534 may be reseeded with vector $g_a$ and LFSR shifted once to store vector $g_b$—since the zero padding does not contribute to summation 536. In an embodiment, operations 520 may calculate for each of data D0, D1, D2, D3, D4 of codeword 522 a product of that data and a respective sequence of vectors of g-register 534—e.g. where the sequence starts at vector $g_b$. Such products may be successively added into a summation 536 which results in calculation of the restored value D4', which is equal to the corresponding original data D4.

Figure 5D:
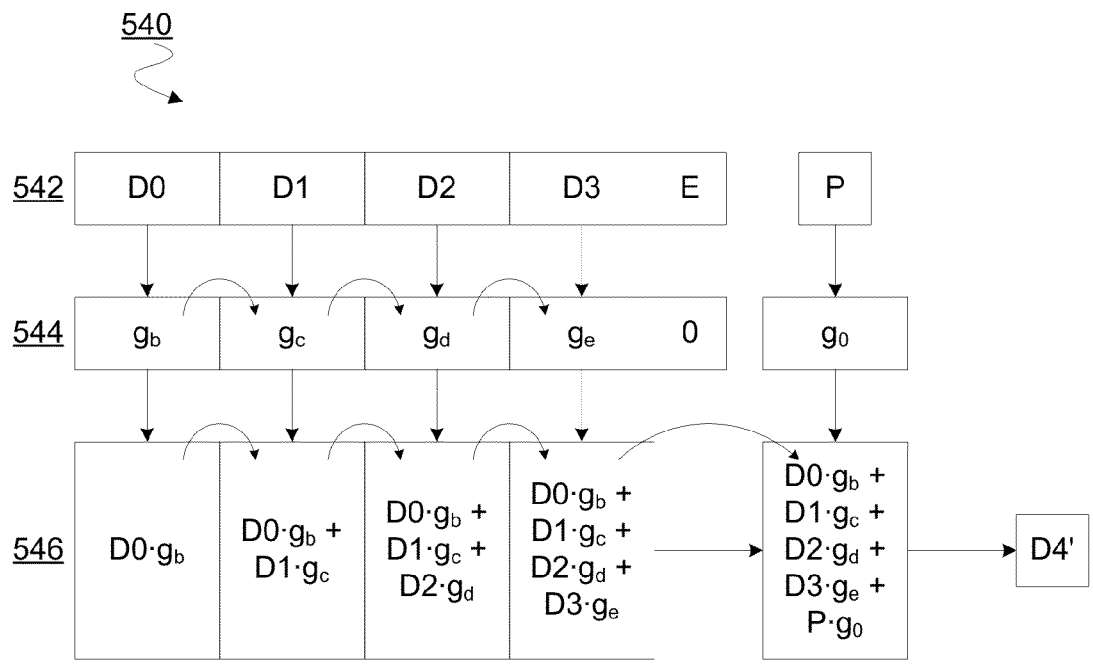

FIG. 5D illustrates operations 540 of BCH encoder logic to recover a data value D4' such as that generated according to different techniques of operations 500. Such BCH encoder logic may be that which performed operations 520 to generate BCH parity value P. The BCH encoder logic may operate serially—e.g. encoding a few bits at a time as it traverses a codeword 542. In contrast to codewords 506, 532, for example, codeword 542 may forego zero (0) padding and/or cycle shifting to move an erased symbol E into the position of the parity value P.

In an embodiment, the BCH encoder logic initializes g-register 544 at the start of encoding to store vector $g_b$ of generator matrix G. Operations may calculate a product of D0 and $g_b$ for storage as an intermediate value of a summation 546. Subsequently, g-register 544 may be LFSR shifted to store vector $g_c$ for calculating a product $D1 \cdot g_c$, which is to be added to summation 546. Operations 540 may further include shifting successive vectors into g-register 544, calculating products—each for a respective one of such successive vectors and corresponding data of codeword 542—and adding such products to summation 546. In an embodiment, the erased symbol E makes no contribution to summation 546. In an embodiment, g-register is reseeded with an initial vector $g_0$ of the generator matrix G, the reseeded to calculate a last contribution to summation 546. For example, adding a product of BCH parity value P and vector $g_0$ as a last contribution to summation 546 may result in calculation of the restored value D4', which is equal to the corresponding original data D4.

Figure 6:
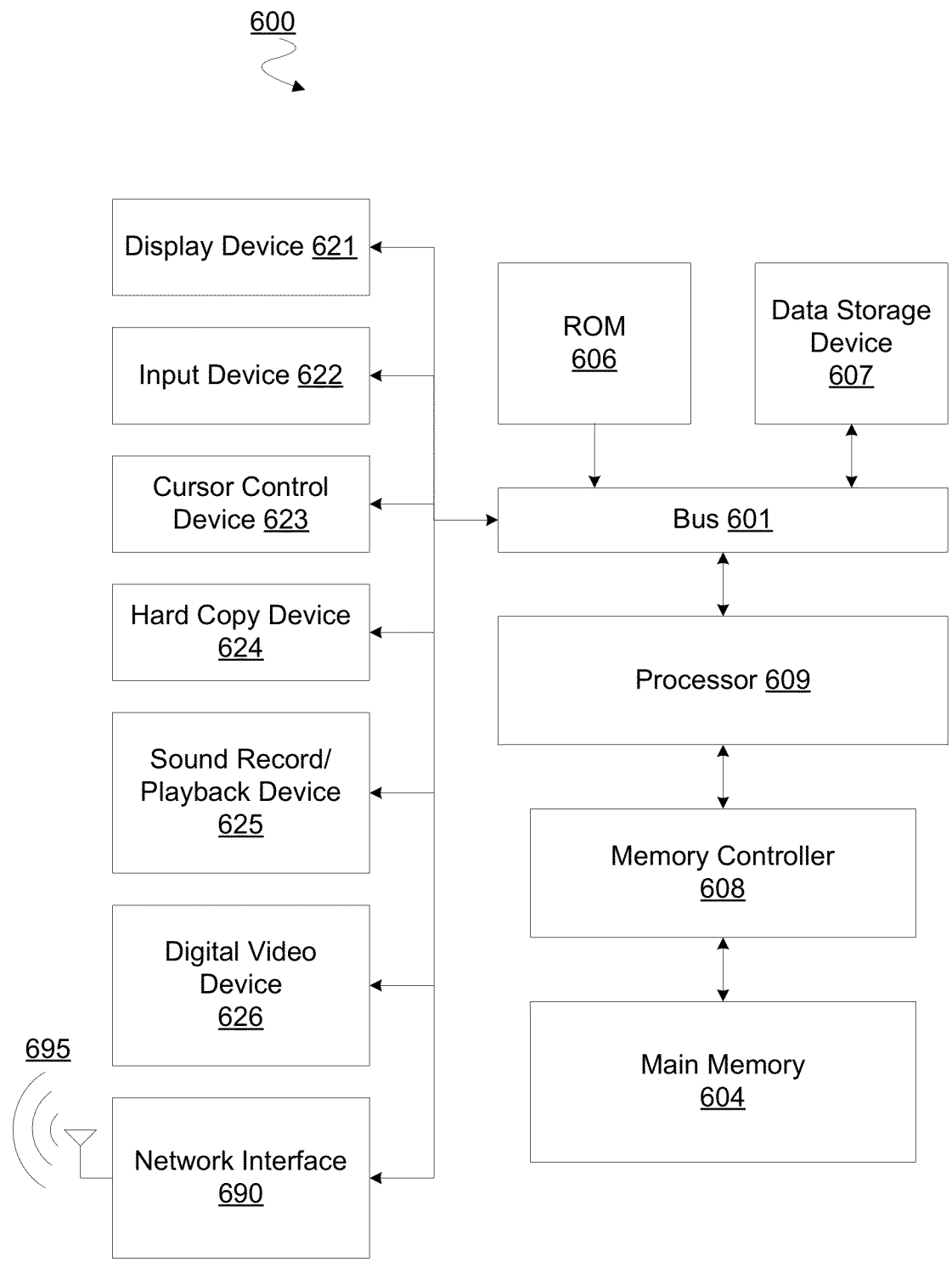
FIG. 6 is a block diagram illustrating elements of a computer system for handling a data fault according to an embodiment.

FIG. 6 shows elements of an illustrative computer platform 600 for handling a data fault according to one embodiment. Computer platform 600 may, for example, include a hardware platform of a computer such as a server, workstation, desktop computer, integrated computer hardware (in a car, airplane, etc.), laptop computer, a handheld computer—e.g. a tablet, palmtop, cell phone, media player, and/or the like—and/or other such computer system.

In an embodiment, computer platform 600 includes at least one interconnect, represented by an illustrative bus 601, for communicating information and a processor 609—e.g. a central processing unit—for processing such information. Processor 609 may include functionality of a complex instruction set computer (CISC) type architecture, a reduced instruction set computer (RISC) type architecture and/or any of a variety of processor architecture types. Processor 609 may couple with one or more other components of computer platform 600 via bus 601. By way of illustration and not limitation, computer platform 600 may include a read only memory (ROM) 606, and/or other static storage device—e.g. where ROM 606 is coupled to processor 609 via bus 601—to store static information and/or instructions for processor 609. Additionally or alternatively, computer platform 600 may include a data storage device 607 (e.g., a magnetic disk, optical disk, and/or other machine readable media) coupled to processor 609— e.g. via bus 601. Data storage device 607 may, for example, include instructions or other information to be operated on and/or otherwise accessed by processor 609.

In an embodiment, computer platform 600 includes a random access memory (RAM) or other dynamic storage device, represented by an illustrative main memory 604 coupled to processor 609 via a memory controller 608. Memory controller 608 may be incorporated into processor 609, in another embodiment. Main memory 604 may store information and/ or instructions to be executed by processor 609. Main memory 604 also may be used for storing temporary variables or other intermediate information during execution of instructions by processor 609. Main memory 604 may include multiple dies each comprising a respective memory array—e.g. where memory arrays of main memory 604 are to store multiple vertical error correction codewords and one or more horizontal BCH codewords. In an embodiment, memory controller 608 includes logic to provide support for handling data faults of main memory 604.

Computer platform 600 may additionally or alternatively include a display device 621 for displaying information to a computer user. Display device 621 may, for example, include a frame buffer, a specialized graphics rendering device, a cathode ray tube (CRT), a flat panel display and/or the like. Additionally or alternatively, computer platform 600 may include an input device 622—e.g. including alphanumeric and/or other keys to receive user input. Additionally or alternatively, computer platform 600 may include a cursor control device 623, such as a mouse, a trackball, a pen, a touch screen, or cursor direction keys to communicate position, selection or other cursor information to processor 609, and/or to control cursor movement—e.g. on display device 621.

Computer platform 600 may additionally or alternatively have a hard copy device 624 such as a printer to print instructions, data, or other information on a medium such as paper, film, or similar types of media. Additionally or alternatively, computer platform 600 may include a sound record/playback device 625 such as a microphone or speaker to receive and/or output audio information. Computer platform 600 may additionally or alternatively include a digital video device 626 such as a still or motion camera to digitize an image. In an embodiment, computer platform 600 includes a network interface 690 for coupling computer platform 600 to a network—e.g. for wireless network communications via one or more antennae 695 coupled thereto.

In one aspect, a device comprises control logic to monitor for a die failure of multiple dies each including a respective one of multiple memory arrays, the control logic further to monitor for a request to perform error correction for the multiple memory arrays. The device further comprises decoder logic coupled to the control logic, wherein, if the request is detected, the decoder logic is to perform the error correction, including the decoder logic to perform a first horizontal Bose, Ray-Chaudhuri, Hocquenghem (BCH) decode operation based on a first BCH code of a first die coupled to the multiple dies, the first BCH code for respective data of each of the multiple memory arrays. The decoder logic to perform the error correction further includes the decoder logic to perform first vertical error correction (VEC) decode operations based on a result of the BCH decode operation and VEC codes each of a respective memory array of the multiple memory arrays and specific to data of the respective memory array. If the die failure is indicated, the decoder logic is to perform a second horizontal BCH decode operation based on a first BCH code for recovery of data of a failed die.

In an embodiment, the first BCH code includes a Reed-Solomon code. In an embodiment, the decoder logic is to perform the second horizontal BCH decode operation further based on information specifying a location in a horizontal codeword for data which is to be recovered. In an embodiment, the multiple memory arrays include one or more BCH codes in addition to the VEC codes, each of the one or more BCH codes for respective data of each of the multiple memory arrays, wherein the first BCH decode operation is further based on the one or more BCH codes.

In an embodiment, the first VEC decode operations generate a first set of vertical codewords, wherein the control logic is further to detect that only a first vertical codeword of the first set of vertical codewords includes an error, wherein, in response to the detecting, the decoder logic is further to perform a second horizontal BCH decode operation based on data of the first set of vertical codewords. In an embodiment, the first VEC decode operations generate a first set of vertical codewords, wherein the control logic is further to detect that multiple vertical codewords of the first set of vertical codewords each include an error, wherein in response to the detecting, the decoder logic is further to perform a second horizontal BCH decode operation based on data of the first set of vertical codewords, and the decoder logic is to perform second VEC decode operations based on a result of the second horizontal BCH decode operation and data of the multiple vertical codewords.

In an embodiment, the decoder logic is to restore a first data symbol of a codeword, including, for a plurality of data symbols of the codeword, the decoder logic to calculate a product of the data symbol and a respective vector of a generator matrix G. The decoder logic is to restore the first data symbol further includes the decoder logic to sum each of the calculated products for the plurality of data symbols to generate an intermediate summation value, the decoder logic to calculate a first product of a BCH parity value of the codeword and a first vector of the generator matrix G, and the decoder logic to add the intermediate summation value and the first product to determine a value of the first data symbol. In an embodiment, the decoder logic is to restore the first data symbol with first encoder logic, wherein the first encoder logic to calculate the BCH parity value prior to restoration of the first data symbol.

In another aspect, a system comprises multiple dies each including a respective one of multiple memory arrays each to store a respective vertical error correction (VEC) code specific to data of the memory array. The system further comprises a first die coupled to the multiple dies to store a first Bose, Ray-Chaudhuri, Hocquenghem (BCH) code for respective data of each of the multiple memory arrays. The system further comprises control logic to monitor for a die failure of multiple dies each including a respective one of multiple memory arrays, the control logic further to monitor for a request to perform error correction for the multiple memory arrays. The system further comprises decoder logic coupled to the control logic, wherein, if the request is detected, the decoder logic is to perform the error correction, including the decoder logic to perform a first horizontal BCH decode operation based on the first BCH code, and the decoder logic to perform first VEC decode operations based on a result of the BCH decode operation and the respective VEC codes of the multiple memory arrays. If the die failure is indicated, the decoder logic is to perform a second horizontal BCH decode operation based on a first BCH code for recovery of data of a failed die.

In an embodiment, the first BCH code includes a Reed-Solomon code. In an embodiment, the decoder logic is to perform the second horizontal BCH decode operation further based on information specifying a location in a horizontal codeword for data which is to be recovered. In an embodiment, the multiple memory arrays include one or more BCH codes in addition to the VEC codes, each of the one or more BCH codes for respective data of each of the multiple memory arrays, wherein the first BCH decode operation is further based on the one or more BCH codes.

In an embodiment, the first VEC decode operations generate a first set of vertical codewords, wherein the control logic further to detect that only a first vertical codeword of the first set of vertical codewords includes an error, wherein, in response to the detecting, the decoder logic further to perform a second horizontal BCH decode operation based on data of the first set of vertical codewords. In an embodiment, the first VEC decode operations generate a first set of vertical codewords, wherein the control logic is further to detect that multiple vertical codewords of the first set of vertical codewords each include an error, wherein in response to the detecting, the decoder logic is further to perform a second horizontal BCH decode operation based on data of the first set of vertical codewords, and the decoder logic is to perform second VEC decode operations based on a result of the second horizontal BCH decode operation and data of the multiple vertical codewords.

In an embodiment, the decoder logic is to restore a first data symbol of a codeword, including, for a plurality of data symbols of the codeword, the decoder logic to calculate a product of the data symbol and a respective vector of a generator matrix G. The decoder logic to restore the first data symbol further includes the decoder logic to sum each of the calculated products for the plurality of data symbols to generate an intermediate summation value, the decoder logic to calculate a first product of a BCH parity value of the codeword and a first vector of the generator matrix G, and the decoder logic to add the intermediate summation value and the first product to determine a value of the first data symbol. In an embodiment, the decoder logic is to restore the first data symbol with first encoder logic, wherein the first encoder logic is to further calculate the BCH parity value prior to restoration of the first data symbol.

In another aspect, a method comprises monitoring for a die failure of multiple dies each including a respective one of multiple memory arrays, monitoring for a request to perform error correction for the multiple memory arrays, and if the request is detected, performing the error correction. Performing the error correction includes performing a first horizontal Bose, Ray-Chaudhuri, Hocquenghem (BCH) decode operation based on a first BCH code of a first die coupled to the multiple dies, the first BCH code for respective data of each of the multiple memory arrays, and performing first vertical error correction (VEC) decode operations based on a result of the BCH decode operation and VEC codes each of a respective memory array of the multiple memory arrays and specific to data of the respective memory array. The method further comprises, if the die failure is indicated, performing a second horizontal BCH decode operation based on a first BCH code for recovery of data of a failed die.

In an embodiment, the first BCH code includes a Reed-Solomon code. In an embodiment, performing the second horizontal BCH decode operation is further based on information specifying a location in a horizontal codeword for data which is to be recovered. In an embodiment, the multiple memory arrays include one or more BCH codes in addition to the VEC codes, each of the one or more BCH codes for respective data of each of the multiple memory arrays, wherein the first BCH decode operation is further based on the one or more BCH codes.

In an embodiment, the first VEC decode operations generate a first set of vertical codewords, where the method further comprises detecting that only a first vertical codeword of the first set of vertical codewords includes an error, and in response to the detecting, performing a second horizontal BCH decode operation based on data of the first set of vertical codewords. In an embodiment, the first VEC decode operations generate a first set of vertical codewords, where the method further comprises detecting that multiple vertical codewords of the first set of vertical codewords each include an error, in response to the detecting, performing a second horizontal BCH decode operation based on data of the first set of vertical codewords, and performing second VEC decode operations based on a result of the second horizontal BCH decode operation and data of the multiple vertical codewords.

In an embodiment, the method further comprises, for a plurality of data symbols of the codeword, calculating a product of the data symbol and a respective vector of a generator matrix G. In such an embodiment, the method further comprises summing each of the calculated products for the plurality of data symbols to generate an intermediate summation value, calculating a first product of a BCH parity value of the codeword and a first vector of the generator matrix G, and adding the intermediate summation value and the first product to determine a value of the first data symbol.

In another aspect, a computer-readable storage medium has stored thereon instructions which, when executed by one or more processing units, cause the one or more processing units to perform a method. The method comprises monitoring for a die failure of multiple dies each including a respective one of multiple memory arrays, monitoring for a request to perform error correction for the multiple memory arrays, and if the request is detected, performing the error correction. Performing the error correction includes performing a first horizontal Bose, Ray-Chaudhuri, Hocquenghem (BCH) decode operation based on a first BCH code of a first die coupled to the multiple dies, the first BCH code for respective data of each of the multiple memory arrays. Performing the error correction further includes performing first vertical error correction (VEC) decode operations based on a result of the BCH decode operation and VEC codes each of a respective memory array of the multiple memory arrays and specific to data of the respective memory array. The method further comprises, if the die failure is indicated, performing a second horizontal BCH decode operation based on a first BCH code for recovery of data of a failed die.

In an embodiment, the first BCH code includes a Reed-Solomon code. In an embodiment, performing the second horizontal BCH decode operation is further based on information specifying a location in a horizontal codeword for data which is to be recovered. In an embodiment, the multiple memory arrays include one or more BCH codes in addition to the VEC codes, each of the one or more BCH codes for respective data of each of the multiple memory arrays, wherein the first BCH decode operation is further based on the one or more BCH codes.

In an embodiment, the first VEC decode operations generate a first set of vertical codewords, where the method further comprises detecting that only a first vertical codeword of the first set of vertical codewords includes an error, and in response to the detecting, performing a second horizontal BCH decode operation based on data of the first set of vertical codewords. In an embodiment, the first VEC decode operations generate a first set of vertical codewords, where the method further comprises detecting that multiple vertical codewords of the first set of vertical codewords each include an error, in response to the detecting, performing a second horizontal BCH decode operation based on data of the first set of vertical codewords, and performing second VEC decode operations based on a result of the second horizontal BCH decode operation and data of the multiple vertical codewords.

In an embodiment, the method further comprises, for a plurality of data symbols of the codeword, calculating a product of the data symbol and a respective vector of a generator matrix G. In such an embodiment, the method further comprises summing each of the calculated products for the plurality of data symbols to generate an intermediate summation value, calculating a first product of a BCH parity value of the codeword and a first vector of the generator matrix G, and adding the intermediate summation value and the first product to determine a value of the first data symbol.

Techniques and architectures for correcting data errors are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
    control logic to monitor for a die failure of multiple dies each including a respective one of multiple memory arrays, the control logic further to monitor for a request to perform error correction for the multiple memory arrays; and
        decoder logic coupled to the control logic, wherein, if the request is detected while each of the multiple dies is operative, the decoder logic to perform the error correction, including:
        the decoder logic to perform a first horizontal Bose, Ray-Chaudhuri, Hocquenghem (BCH) decode operation based on a first BCH code of a first die coupled to the multiple dies, the first BCH code generated based on respective data of each of the multiple memory arrays; and
    the decoder logic to perform first vertical error correction (VEC) decode operations based on a result of the BCH decode operation and VEC codes each of a respective memory array of the multiple memory arrays, wherein, for each of the VEC codes, the VEC code is specific to data of the respective memory array which includes the VEC code;
    wherein, if the die failure is indicated, the decoder logic to perform a second horizontal BCH decode operation based on the first BCH code for recovery of data of a failed die.

2. The device of claim 1, wherein the first BCH code includes a Reed-Solomon code.

3. The device of claim 1, wherein the decoder logic to perform the second horizontal BCH decode operation further based on information specifying a location in a horizontal codeword for data which is to be recovered.

4. The device of claim 1, wherein the multiple memory arrays include one or more BCH codes in addition to the VEC codes, wherein, for each of the one or more BCH codes, the BCH code is generated based on respective data of each of the multiple memory arrays, wherein the first BCH decode operation is further based on the one or more BCH codes.

5. The device of claim 1, wherein the first VEC decode operations generate a first set of vertical codewords, the control logic to detect that only a first vertical codeword of the first set of vertical codewords includes an error, wherein, in response to the detecting, the decoder logic to perform a second horizontal BCH decode operation based on data of the first set of vertical codewords.

6. The device of claim 1, wherein the first VEC decode operations generate a first set of vertical codewords, the control logic to detect that multiple vertical codewords of the first set of vertical codewords each include an error, wherein in response to the detecting, the decoder logic to perform a second horizontal BCH decode operation based on data of the first set of vertical codewords, and the decoder logic to perform second VEC decode operations based on a result of the second horizontal BCH decode operation and data of the multiple vertical codewords.

7. The device of claim 1, wherein the decoder logic to restore a first data symbol of a codeword, including:
    the decoder logic to calculate a plurality of products, including, for each of a plurality of data symbols of the codeword, the decoder logic to calculate a respective product of the data symbol and a respective vector of a generator matrix G;
    the decoder logic to sum the plurality of products to generate an intermediate summation value;
    the decoder logic to calculate a first product of a BCH parity value of the codeword and a first vector of the generator matrix G; and
    the decoder logic to add the intermediate summation value and the first product to determine a value of the first data symbol.

8. The device of claim 7, wherein the decoder logic to restore the first data symbol with first encoder logic, wherein the first encoder logic to calculate the BCH parity value prior to restoration of the first data symbol.

9. A system comprising:
    multiple dies each including a respective one of multiple memory arrays each to store a respective one of vertical error correction (VEC) codes, wherein for each of the VEC codes, the VEC code is specific to data of the memory array which stores the VEC code;
    a first die coupled to the multiple dies to store a first Bose, Ray-Chaudhuri, Hocquenghem (BCH) code for respective data of each of the multiple memory arrays; and
    control logic to monitor for a die failure of the multiple dies, the control logic further to monitor for a request to perform error correction for the multiple memory arrays; and
    decoder logic coupled to the control logic, wherein, if the request is detected while each of the multiple dies is operative, the decoder logic to perform the error correction, including the decoder logic to perform a first horizontal BCH decode operation based on the first BCH code, and the decoder logic to perform first VEC decode operations based on a result of the BCH decode operation and the VEC codes;

wherein, if the die failure is indicated, the decoder logic to perform a second horizontal BCH decode operation based on a first BCH code for recovery of data of a failed die.

10. The system of claim 9, wherein the first BCH code includes a Reed-Solomon code.

11. The system of claim 9, wherein the decoder logic to perform the second horizontal BCH decode operation further based on information specifying a location in a horizontal codeword for data which is to be recovered.

12. The system of claim 9, wherein the multiple memory arrays include one or more BCH codes in addition to the VEC codes, wherein, for each of the one or more BCH codes, the BCH code is generated based on respective data of each of the multiple memory arrays, wherein the first BCH decode operation is further based on the one or more BCH codes.

13. The system of claim 9, wherein the first VEC decode operations generate a first set of vertical codewords, the control logic to detect that only a first vertical codeword of the first set of vertical codewords includes an error, wherein, in response to the detecting, the decoder logic to perform a second horizontal BCH decode operation based on data of the first set of vertical codewords.

14. The system of claim 9, wherein the first VEC decode operations generate a first set of vertical codewords, the control logic to detect that multiple vertical codewords of the first set of vertical codewords each include an error, wherein in response to the detecting, the decoder logic to perform a second horizontal BCH decode operation based on data of the first set of vertical codewords, and the decoder logic to perform second VEC decode operations based on a result of the second horizontal BCH decode operation and data of the multiple vertical codewords.

15. The system of claim 9, wherein the decoder logic to restore a first data symbol of a codeword, including:
the decoder logic to calculate a plurality of products, including, for each of a plurality of data symbols of the codeword, the decoder logic to calculate a product of the data symbol and a respective vector of a generator matrix G;
the decoder logic to sum the plurality of products to generate an intermediate summation value;
the decoder logic to calculate a first product of a BCH parity value of the codeword and a first vector of the generator matrix G; and
the decoder logic to add the intermediate summation value and the first product to determine a value of the first data symbol.

16. The system of claim 15, wherein the decoder logic to restore the first data symbol with first encoder logic, wherein the first encoder logic to calculate the BCH parity value prior to restoration of the first data symbol.

17. A method comprising:
monitoring for a die failure of multiple dies each including a respective one of multiple memory arrays;
monitoring for a request to perform error correction for the multiple memory arrays;
if the request is detected while each of the multiple dies is operative, performing the error correction, including:
performing a first horizontal Bose, Ray-Chaudhuri, Hocquenghem (BCH) decode operation based on a first BCH code of a first die coupled to the multiple dies, the first BCH code for respective data of each of the multiple memory arrays; and
performing first vertical error correction (VEC) decode operations based on a result of the BCH decode operation and VEC codes each of a respective memory array of the multiple memory arrays, wherein, for each of the VEC codes, the VEC code is specific to data of the respective memory array which includes the VEC code; and
if the die failure is indicated, performing a second horizontal BCH decode operation based on a first BCH code for recovery of data of a failed die.

18. The method of claim 17, wherein the first BCH code includes a Reed-Solomon code.

19. The method of claim 17, wherein performing the second horizontal BCH decode operation is further based on information specifying a location in a horizontal codeword for data which is to be recovered.

20. The method of claim 17, wherein the multiple memory arrays include one or more BCH codes in addition to the VEC codes, wherein, for each of the one or more BCH codes, the BCH code is generated based on respective data of each of the multiple memory arrays, wherein the first BCH decode operation is further based on the one or more BCH codes.

21. The method of claim 17, wherein the first VEC decode operations generate a first set of vertical codewords, the method further comprising:
detecting that only a first vertical codeword of the first set of vertical codewords includes an error; and
in response to the detecting, performing a second horizontal BCH decode operation based on data of the first set of vertical codewords.

22. The method of claim 17, wherein the first VEC decode operations generate a first set of vertical codewords, the method further comprising:
detecting that multiple vertical codewords of the first set of vertical codewords each include an error;
in response to the detecting, performing a second horizontal BCH decode operation based on data of the first set of vertical codewords; and
performing second VEC decode operations based on a result of the second horizontal BCH decode operation and data of the multiple vertical codewords.

23. The method of claim 17, further comprising restoring a first data symbol of a codeword, including:
calculating a plurality of products, including, for each of a plurality of data symbols of the codeword, calculating a product of the data symbol and a respective vector of a generator matrix G;
summing the plurality of products to generate an intermediate summation value;
calculating a first product of a BCH parity value of the codeword and a first vector of the generator matrix G; and
adding the intermediate summation value and the first product to determine a value of the first data symbol.

24. A non-transitory computer-readable storage medium having stored thereon instructions which, when executed by one or more processing units, cause the one or more processing units to perform a method comprising:
monitoring for a die failure of multiple dies each including a respective one of multiple memory arrays;
monitoring for a request to perform error correction for the multiple memory arrays;
if the request is detected while each of the multiple dies is operative, performing the error correction, including:

performing a first horizontal Bose, Ray-Chaudhuri, Hocquenghem (BCH) decode operation based on a first BCH code of a first die coupled to the multiple dies, the first BCH code for respective data of each of the multiple memory arrays; and performing first vertical error correction (VEC) decode operations based on a result of the BCH decode operation and VEC codes each of a respective memory array of the multiple memory arrays, wherein, for each of the VEC codes, the VEC code is specific to data of the respective memory array which includes the VEC code; and if the die failure is indicated, performing a second horizontal BCH decode operation based on a first BCH code for recovery of data of a failed die.

25. The computer-readable storage medium of claim 24, wherein the first BCH code includes a Reed-Solomon code.

26. The computer-readable storage medium of claim 24, wherein performing the second horizontal BCH decode operation is further based on information specifying a location in a horizontal codeword for data which is to be recovered.

27. The computer-readable storage medium of claim 24, wherein the multiple memory arrays include one or more BCH codes in addition to the VEC codes, wherein, for each of the one or more BCH codes, the BCH code is generated based on respective data of each of the multiple memory arrays, wherein the first BCH decode operation is further based on the one or more BCH codes.

28. The computer-readable storage medium of claim 24, wherein the first VEC decode operations generate a first set of vertical codewords, the method further comprising:

detecting that only a first vertical codeword of the first set of vertical codewords includes an error; and in response to the detecting, performing a second horizontal BCH decode operation based on data of the first set of vertical codewords.

29. The computer-readable storage medium of claim 24, wherein the first VEC decode operations generate a first set of vertical codewords, the method further comprising:

detecting that multiple vertical codewords of the first set of vertical codewords each include an error;

in response to the detecting, performing a second horizontal BCH decode operation based on data of the first set of vertical codewords; and performing second VEC decode operations based on a result of the second horizontal BCH decode operation and data of the multiple vertical codewords.

30. The computer-readable storage medium of claim 24, the method further comprising restoring a first data symbol of a codeword, including:

calculating a plurality of products, including, for each of a plurality of data symbols of the codeword, calculating a product of the data symbol and a respective vector of a generator matrix G;

summing the plurality of products to generate an intermediate summation value;

calculating a first product of a BCH parity value of the codeword and a first vector of the generator matrix G; and adding the intermediate summation value and the first product to determine a value of the first data symbol.

* * * * *